(12) United States Patent
Kottschlag

(10) Patent No.: US 7,567,120 B2
(45) Date of Patent: Jul. 28, 2009

(54) VARACTOR DIODE ALTERNATIVE CIRCUIT

(75) Inventor: Gerhard Kottschlag, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 30 days.

(21) Appl. No.: 10/587,662

(22) PCT Filed: Jan. 24, 2005

(86) PCT No.: PCT/EP2005/050285

§ 371 (c)(1),
(2), (4) Date: Jul. 26, 2006

(87) PCT Pub. No.: WO2005/074132

PCT Pub. Date: Aug. 11, 2005

(65) Prior Publication Data

US 2007/0164833 A1 Jul. 19, 2007

(30) Foreign Application Priority Data

Jan. 30, 2004 (DE) .................. 10 2004 004 707

(51) Int. Cl.
*H01L 29/93* (2006.01)
(52) U.S. Cl. ....................... 327/586; 332/136
(58) Field of Classification Search ............... 327/586; 332/136
See application file for complete search history.

(56) References Cited

U.S. PATENT DOCUMENTS

| 4,536,724 A | * | 8/1985 | Hasegawa et al. ........ 331/177 V |
| 4,621,205 A | | 11/1986 | Miller |
| 5,302,922 A | * | 4/1994 | Heidemann et al. ........... 333/18 |
| 5,990,761 A | * | 11/1999 | Hamparian et al. ......... 333/164 |

FOREIGN PATENT DOCUMENTS

WO    WO 03/038996    5/2003

* cited by examiner

*Primary Examiner*—Kenneth B Wells
*Assistant Examiner*—John W Poos
(74) *Attorney, Agent, or Firm*—Kenyon & Kenyon LLP

(57) ABSTRACT

To avoid intermodulation interferences, a varactor diode alternative circuit has at least three varactor diodes connected in series alternatingly opposite to one another and a resistor and/or inductor network. At each of the varactor diodes, a control voltage supplied to the circuit for adjusting capacitance is at least approximately at full extent. An alternating voltage applied at the series connection, which is at a higher frequency than the control voltage, is distributed at least approximately uniformly to the varacter diodes. Even for an at least not substantially larger tuning voltage than the amplitude of a signal voltage to be processed in the oscillator circuit that has the alternative circuit, reactions of the signal voltage on the set capacitance of the varactor diode alternative circuit remain negligible, or at least low. The circuit may be used in an electrical, e.g., battery-operated, unit in which only one small operating voltage is available.

4 Claims, 2 Drawing Sheets

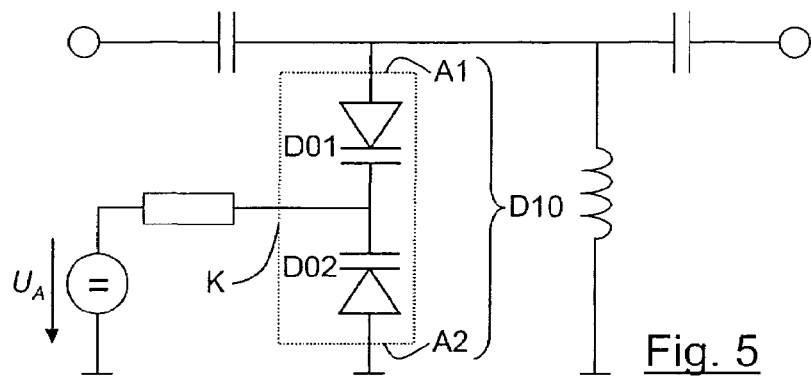
Fig. 5
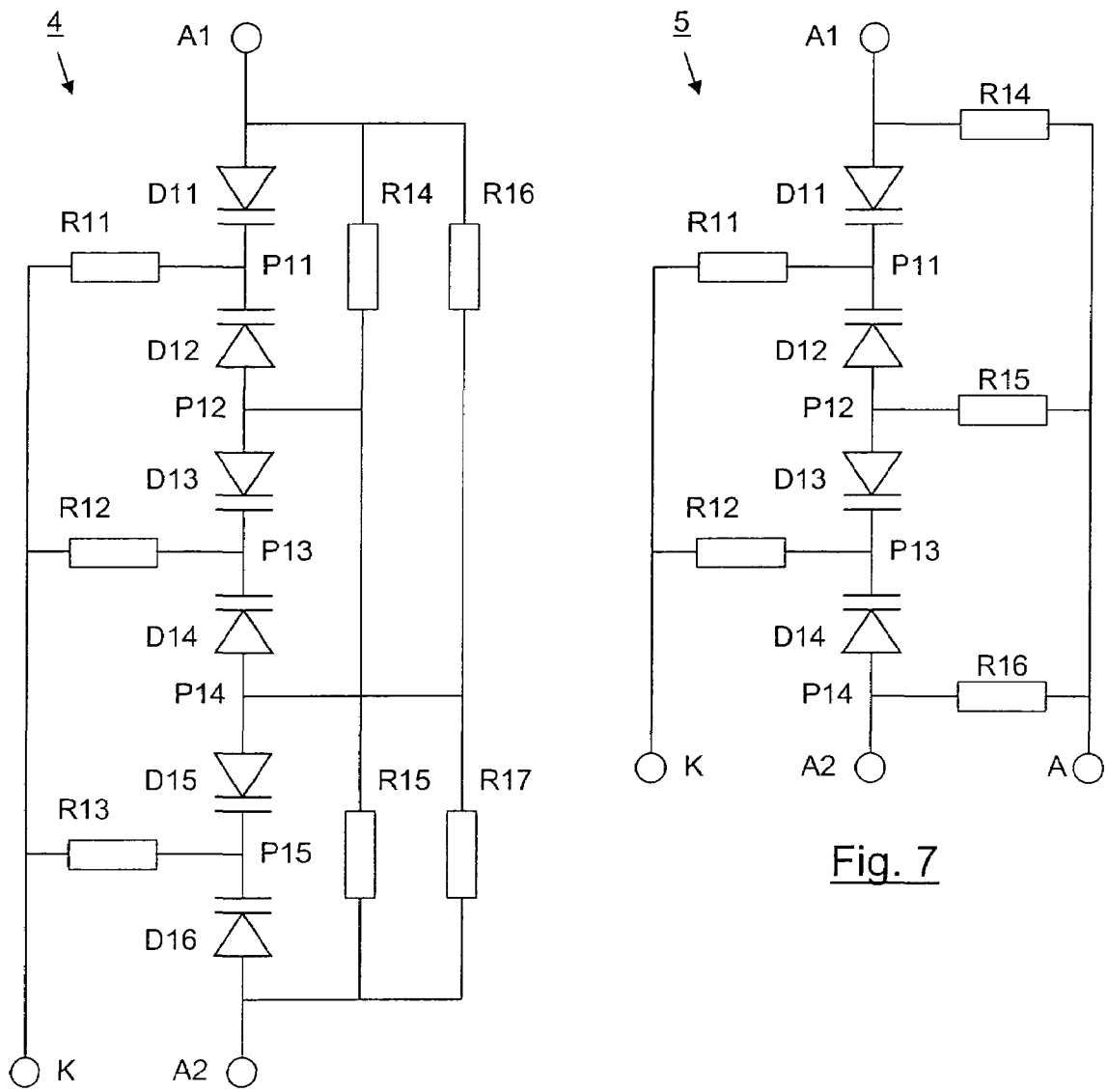
Fig. 6
Fig. 7

VARACTOR DIODE ALTERNATIVE CIRCUIT

BACKGROUND INFORMATION

Conventionally, varactor diodes may be used for tuning oscillator circuits. Varactor diodes are diodes that have a particularly pronounced dependence of their blocking capacitance on the electrical voltage that is applied. By applying an electrical direct voltage to the varactor diode, this effect may be used to set its capacitance and thereby the resonant frequency or other parameters of an oscillator circuit.

In order to be able to cover a large frequency range, using these oscillator circuits or filters, it may be advantageous if the varactor diodes used have a large capacitance ratio or a large capacitance swing, that is, the relative difference between the smallest and the largest capacitance value that may be set is particularly great. In particular, the entire available capacitance swing of the varactor diodes should be achievable even when having low control voltages applied, so that the entire range may be utilized in the case of battery-operated units. The same also applies in connection with integrated circuits, which often have to be supplied, in the course of smaller semiconductor structures, with ever lower operating voltages, so that a subsequent voltage increase to achieve higher control voltages for the varactor diode would usually be too costly.

Since the capacitance of conventional varactor diodes changes very rapidly with the voltage controlling them, varactor diodes not only react to the direct voltage applied, but also to the signal voltage applied to the oscillator circuit. In the case of large signal voltage levels, the capacitance of the varactor diode accordingly fluctuates in time with the useful signal, that is to be processed in the oscillator circuit, so strongly that distortions in the signal come about, especially intermodulation. In this connection, interference signal components may be created that impair the useful signal, and cannot be subsequently filtered out. This effect occurs particularly strongly in diodes having a large capacitance ratio, since, in this instance, even smaller signal voltages are sufficient in order to generate a no longer acceptable interference signal strength.

Conventionally, to correct this two varactor diodes having opposite polarity are connected in series (FIG. 5). In this connection, at both diodes respectively the direct voltage becomes effective for the capacitance change, but only half the alternating voltage, which leads to correspondingly smaller interference products. In addition, the opposite connection has the effect that each of the half waves acts in a capacitance-increasing manner on one of the diodes, and in a capacitance-decreasing manner on the respective other diode, which also acts counter to the creation of interference products.

SUMMARY

An example varactor diode alternative circuit according to the present invention may have the advantage that even for a smaller, or not larger, or not substantially larger tuning voltage compared to the amplitude of a signal voltage that is to be processed in the oscillator circuit, the reactions of the signal voltage on the set capacitance of the varactor diode alternative circuit remain negligible, or at least low. Thus, intermodulation interferences are effectively avoided. This may be achieved, according to an example embodiment of the present invention, by a circuit made up of a series connection of at least three varactor diodes connected in series to one another or parallel connections made up of varactor diodes in connection with a wiring network made up of ohmic resistors and/or inductors or similarly acting elements. This has the effect that, at each of the varactor diodes, an adjusting direct voltage applied to the alternative circuit becomes effective in each case in its full measure, whereas an applied signal alternating voltage is present at each of the diodes of the alternative circuit in each case only at a fraction corresponding to the number of the respective diodes used. In addition, the wiring has the effect that the influences of the signal voltages, because of the alternating opposite connections, for one part of the diodes result in increasing the capacitance, and for a second part of the diodes of the alternative circuit result in decreasing the capacitance, and as a result, the influences of the signal voltage cancel out, at least partially.

The varactor diode alternative circuit according to the example embodiment of the present invention may be suitable, in this context, especially as a substitute for conventional varactor diodes or varactor double diodes in electrical units, in which the signal voltage that is to be processed is on the order of magnitude of the available tuning voltage, that is, particularly, for example, for battery-operated units. In particular, in the case of such units, using the alternative circuit according to the example embodiment of the present invention, no conversion of the available battery voltage or supply voltage to a higher tuning voltage for the varactor diode alternative circuit needs to be provided. Consequently, in an electrical unit according to an example embodiment of the present invention, having a varactor diode alternative circuit according to the present invention, one may do without an otherwise usual boost chopper for a derivative of the low supply voltage. This is not only a cost advantage, but also reduces in an advantageous manner the electromagnetic interferences accompanying the operation of boost choppers usually used as switching-power parts. Consequently, the expenditure for interference suppression of a unit according to the present invention is also reduced.

Furthermore, the varactor diode alternative circuit according to the example embodiment of the present invention is especially suitable in circuits in which a large capacitance swing is to be achieved using a small tuning voltage swing, and therefore the tuning voltage is on the order of magnitude of the signal voltage amplitude or even below it.

In addition, fewer demands are made on a direct voltage decoupling of the oscillator circuit in which the varactor diode is replaced by the alternative circuit according to the present invention, since the tuning direct voltage for controlling the blocking layer capacitance of the varactor diode alternative circuit is substantially smaller, in relation to the signal voltage, than it is able to be in usual varactor diodes.

The alternative circuit according to the example embodiment of the present invention may be implemented in a particularly advantageous manner in the form of an integrated circuit. A circuitry configuration according to the present invention, which includes a varactor diode alternative circuit according to the present invention, for example, an oscillator circuit, may also advantageously be implemented in the form of an integrated circuit.

BRIEF DESCRIPTION OF THE DRAWINGS

Exemplary embodiments of the present invention are depicted in the figures and are explained below. The same reference numerals in figures designate the same elements in this context.

FIG. 5 shows for example, a circuit diagram of a second oscillator circuit in which a series connection of two varactor diodes, connected in series in opposite directions, according to the related art, is installed as an electrically controllable capacitance for tuning the oscillator circuit.

FIG. 6 shows a circuit diagram of a second exemplary embodiment of a varactor diode alternative circuit according to the present invention.

FIG. 7 shows a circuit diagram of a third exemplary embodiment of a varactor diode alternative circuit according to the present invention.

DESCRIPTION OF EXAMPLE EMBODIMENTS

Varactor diodes are also used in circuits in which the capacitance-controlling signal is not a direct voltage, but an alternating voltage, for instance, for frequency modulation of a high-frequency signal as a function of a low-frequency alternating voltage, such as an audio signal. Generally, the frequency of the capacitance-controlling signal deviates clearly from the frequency of those signals which are processed in the controlled signal path, for instance, in a frequency-variable oscillator circuit.

The activation of the alternative circuit according to the present invention by an alternating voltage is also possible, and lies within the scope of the present invention. From here on, for the better understanding of the function, the capacitance-controlling voltage is frequently designated as direct voltage, without excluding thereby comparable applications using capacitance-controlling alternating voltages.

Figures 2, 3, 4:
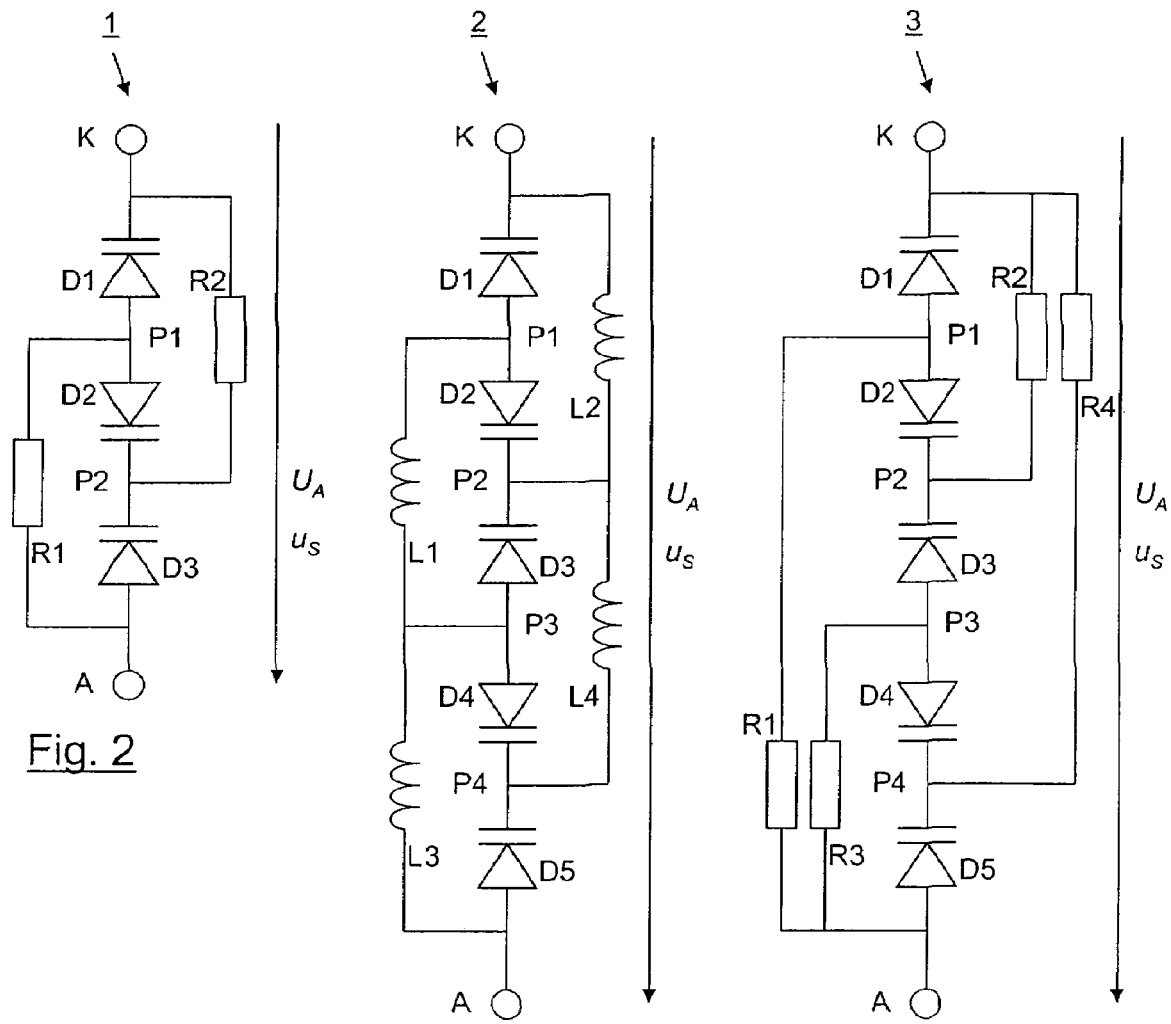
FIG. 2 shows a circuit diagram of a first exemplary embodiment of a varactor diode alternative circuit according to the present invention.
FIG. 3 shows a circuit diagram of a first variant of the first exemplary embodiment of a varactor diode alternative circuit according to the present invention.
FIG. 4 shows a circuit diagram of a second variant of the first exemplary embodiment of a varactor diode alternative circuit according to the present invention.

FIG. 2 shows, for example, a circuit diagram of an oscillator circuit in which a conventional varactor diode DO is installed as an electrically controllable capacitance for tuning the oscillator circuit. The capacitance of varactor diode DO is determined by a control direct voltage $U_A$, applied between its anode A and its cathode K.

To replace this described varactor diode DO, one of the alternative circuits according to FIGS. 2 through 4, that are described below, may advantageously be used.

FIG. 2 shows a circuit diagram of a first exemplary embodiment of a varactor diode alternative circuit according to the present invention. This is made up of a series connection of, in this case, three varactor diodes D1, D2 and D3, which are connected in series in each case alternatingly in the opposite direction to one another, and a resistor network having resistors R1 and R2.

The cathode of first varactor diode D1 at the same time forms cathode K of the entire varactor diode alternative circuit. The anode of first varactor diode D1 is connected at a first node P1 to the anode of second varactor diode D2. The cathode of second varactor diode D2 is connected at a second node P2 to the cathode of the third varactor diode D3. The anode of third varactor diode D2 forms the anode of the varactor diode alternative circuit.

First node P1, that is, the anodes of first varactor diode D1 and second varactor diode D2, is connected via a first ohmic resistor R1 to the anode of third varactor diode D3, and consequently also to the anode of the varactor diode alternative circuit. Second node P2, that is, the cathodes of second varactor diode D2 and third varactor diode D3 are connected via a second ohmic resistor R2 to the cathode of first varactor diode D1, and therewith to the cathode of the varactor diode alternative circuit. In this context, the resistor values are selected so that they are advantageously in the range of tenfold the oscillator circuit impedance, or even higher. Thus, in applications in the radio receiver field, usual values will be of the order of magnitude between 1 kohm and one mohm.

The wiring described of varactor diodes D1 to D3 has the effect that no current flows through the alternative circuit at a positive direct voltage $U_A$ applied between the cathode and the anode, and therefore, via second ohmic resistor R2, the cathodes of second varactor diode D2 and third varactor diode D3 are at the same electrical potential as the cathode of first varactor diode D1. Likewise, the anodes of first varactor diode D1 and second varactor diode D2, via the first ohmic resistor, are at the same electrical potential as the anode of third varactor diode D3. Accordingly, the same adjusting and tuning voltage $U_A$ is applied over each of varactor diodes D1, D2 and D3 as over the entire varactor diode alternative circuit.

With regard to an applied alternating voltage $u_S$, varactor diodes D1, D2 and D3 generally represent capacitances. Consequently, an alternating voltage applied in the oscillator circuit at the varactor diodes alternative circuit decreases over the series connection of the three varactor diodes D1 to D3, that is, generally of the series connection of the capacitances of the varactor diodes D1 to D3. Thus, at each of the varactor diodes, generally only one third of the alternating voltage or signal voltage is present in each case.

FIG. 3 shows a circuit diagram of a first variant 2 of the first exemplary embodiment of a varactor diode alternative circuit according to the present invention. In the present case, this includes five varactor diodes D1, D2, D3, D4 and D5 connected in series alternatingly in the opposite direction to one another, as well as an inductor network made up of four inductors L1, L2, L3 and L4.

The cathode of first varactor diode D1 at the same time forms cathode K of the entire varactor diode alternative circuit.

The anode of first varactor diode D1 is connected to the anode of second varactor diode D2 at a node P1, and the anode of third varactor diode D3 is connected to the anode of the fourth varactor diode at a third node. The cathode of second varactor diode D2 is connected to the cathode of third varactor diode D3 at a second node P2, and the cathode of the fourth varactor diode is connected to the cathode of fifth varactor diode D5 at a fourth node P4. The anode of fifth varactor diode D5 forms the anode of the varactor diode alternative circuit.

First node P1, that is, the anodes of first varactor diode D1 and second varactor diode D2, is connected via a first inductor L1 to the anodes of third varactor diode D3 and fourth varactor diode D4, that is, to third node P3. Node P3, that is, the anodes of third varactor diode D3 and fourth varactor diode D4, is connected to the anode of fifth varactor diode D5 via a third inductor L3, and therewith to anode A of entire varactor diode alternative circuit 2. Second node P2, that is, the cathodes of second varactor diode D2 and third varactor diode D3, is connected via a second inductor L2 to the cathode of first varactor diode D1, and therewith to cathode K of the varactor diode alternative circuit. Second node P2 is also connected via a fourth inductor L4 to fourth node P4, and therewith to the cathodes of fourth varactor diode D4 and fifth varactor diode D5.

In this context, the inductance values are selected in such a way that the impedance of the inductors at the oscillator circuit resonant frequency are preferably a tenfold above the oscillator circuit impedance, or even higher.

The acting principle of second specific embodiment 2 generally corresponds to first specific embodiment 1. With regard to a positive tuning direct voltage $U_A$ applied between cathode K and anode A, the series connection of varactor diodes D1 to D5 generally represents an open circuit operation, so that the anodes of all varactor diodes D1 to D5 are at the potential of anode A of the alternative circuit, and the cathodes of all varactor diodes D1 to D5 are at the potential of cathode K of the alternative circuit. Consequently, full tuning direct voltage $U_A$ is present over each of varactor diodes D1 to D5, from their cathode to their anode. The wiring of the diodes, in this example inductors, is high ohmic with regard to signal voltage $U_S$, but the entire alternative circuit 3 represents an infinite impedance, which generally comes about from the series connection of the blocking layer capacitances of varactor diodes D1 to D5. Consequently, an applied direct voltage becomes effective for each of the diodes, but an alternating voltage is effective for each of the diodes only to the extent of a fifth.

Apart from the number of the varactor diodes connected in series, the first two specific embodiments thus differ mainly in the type of components used for the wiring connection, namely, in case 1, the ohmic resistors, and in case 2 the inductors. Compared to ohmic resistors, inductors offer the advantage that, at a suitable selection of their inductance values with respect to a changing tuning voltage $U_A$, they have a lower impedance than ohmic resistors, and thereby they make possible a more rapid adjustment of the varactor diode alternative circuit to a changed capacitance value.

The impedances of the components of the wiring network should be clearly higher than the impedance of the entire oscillator circuit, in order to influence the latter's characteristics as little as possible, but limits are set to any desired increase in the impedance of the network elements because a change in the tuning voltage $U_A$ is supposed to effect as speedy as possible a change in the overall capacitance of varactor diode alternative circuit 1, 2 or 3.

In addition, inductors as elements of the wiring network are suitable as substitutes for ohmic resistors if the frequencies or frequency ranges of signal voltages $u_S$ to be processed in the oscillator circuit are clearly different from the required rates of change in the capacitance values of varactor diode alternative circuits 1, 2 or 3, in other words, if the period duration of the signal voltages are clearly less than the time constants of the low-pass filters formed by the network elements. Deviating wirings of the diode in-series connections, for instance, using low-pass filters of higher orders, perhaps RL elements, are possible, and lie within the scope of the present invention.

FIG. 4 shows a circuit diagram of a second variant 3 of the first exemplary embodiment of a varactor diode alternative circuit according to the present invention. In the present case, this includes five varactor diodes D1, D2, D3, D4 and D5 connected in series alternatingly in the opposite direction to one another, as well as an resistor network made up of four resistors R1, R2, R3 and R4.

The cathode of first varactor diode D1 at the same time forms cathode K of the entire varactor diode alternative circuit. The anode of first varactor diode D1 is connected to the anode of second varactor diode D2 at a node P1, and the anode of third varactor diode D3 is connected to the anode of the fourth varactor diode at a third node. The cathode of second varactor diode D2 is connected to the cathode of third varactor diode D3 at a second node P2, and the cathode of the fourth varactor diode is connected to the cathode of fifth varactor diode D5 at a fourth node P4. The anode of fifth varactor diode D5 forms the anode of the varactor diode alternative circuit.

First node P1, that is, the anodes of first varactor diode D1 and second varactor diode D2, is connected via a first ohmic resistor R1 to the anode of fifth varactor diode D5, and consequently also to the anode of entire varactor diode alternative circuit 3. Third node P3, that is, the anodes of third varactor diode D3 and fourth varactor diode D4, is also connected to the anode of fifth varactor diode D5 via a third ohmic resistor R3, and therewith to anode A of entire varactor diode alternative circuit 2. Second node P2, that is, the cathodes of second varactor diode D2 and third varactor diode D3 is connected via a second ohmic resistor R2 to the cathode of first varactor diode D1, and therewith to cathode K of the varactor diode alternative circuit. Fourth node P4, and consequently the cathodes of fourth varactor diode D4 and fifth varactor diode D5 is also connected via a fourth ohmic resistor R4 to the cathode of first varactor diode D1, and therewith to cathode K of the varactor diode alternative circuit.

The mode of operation of third alternative circuit 3 corresponds generally to the alternative circuits explained above.

The third alternative circuit differs from the above second alternative circuit 2 not only by the use of ohmic resistors instead of inductors. The elements may optionally be exchanged here too, given the above-mentioned boundary conditions. Rather, the wiring network differs from second alternative circuit 2 in that nodes P2 and P4, and P1 and P3, are in each case connected directly, via only a single component, to the respective terminal of the alternative circuit, that is, nodes P1 and P2 are connected to Anode A and nodes P2 and P4 to cathode K.

FIG. 5, for example, shows a circuit diagram of a second oscillator circuit in which a series connection of two varactor diodes D01 and D02, connected in series in opposite directions, is installed as an electrically controllable capacitance for tuning the oscillator circuit. In this varactor diode alternative circuit D10, that is also commonly manufactured and marketed as a single component having three terminals, the two diodes D01 and D02 are connected by their cathodes. The cathode connecting terminals are guided as one in-common cathode terminal from the diode housing, and the anodes of the two diodes D01 and D02 as separate anode terminals A1 and A2. An applied tuning direct voltage $U_A$ is effective, in this case, equally in full measure for both diodes D01 and D02, but a signal alternating voltage $u_S$ applied via anode terminals A1 and A2 in each case only to the extent of a half.

FIG. 6 shows a circuit diagram of a second exemplary embodiment of a varactor diode alternative circuit 4 according to the present invention to substitute for varactor diode alternative circuit D10 of FIG. 5. By contrast to alternative circuits 1, 2 and 3, described up to now, this includes an even number of, in the present case six, varactor diodes D11, D12, D13, D14, D15 and D16, connected in series and alternatingly opposite to one another, as well as a resistor network or, more generally, an impedance network made up of seven resistors R11, R12, R13, R14, R15, R16 and R17.

The anode of first varactor diode D11 at the same time forms a first anode A1 of the entire varactor diode alternative circuit. The cathode of first varactor diode D11 is connected to the cathode of second varactor diode D12 at a first node P11, the cathode of third varactor diode D13 is connected to the cathode of fourth varactor diode D14 at a third node P13, the cathode of fifth varactor diode D15 is connected to the cathode of sixth varactor diode D16 at a fifth node P15. The anode of sixth varactor diode D16 at the same time forms a second anode terminal A2 of varactor diode alternative circuit 4.

Furthermore, this anode of second varactor diode D12 is connected to the anode of third varactor diode D13 at a second node P12, and, in addition, the anode of fourth varactor diode D14 is connected to the anode of fifth varactor diode D15 at a fourth node P14.

The wiring of the diode series connection described is described below, using the example of resistors, but, in analogy to the specific embodiments described above, of the first exemplary embodiment, it could just as well be embodied using inductors or alternatively using low-pass filters, that is, for example, using RL elements.

First node P11, that is, the cathodes of first varactor diode D11 and second varactor diode D12, is connected to a cathode terminal K of alternative circuit 4, via a first ohmic resistor R11. In the same manner, third node P13, that is, the cathode of third varactor diode D13 and fourth varactor diode D14, is connected via a second ohmic resistor R12, and fifth node P15, that is, the cathodes of fifth varactor diode D15 and sixth varactor diode D16, is connected via a third ohmic resistor R13 to cathode terminal K of the entire circuit 4.

Furthermore, second node P12 is connected via a fourth resistor R14 to the anode of first diode D11, that is, first anode terminal A1 of the overall circuit, and is connected via a fifth ohmic resistor R15 to the anode of sixth diode D16, that is, second anode terminal A2 of overall circuit 4. In analogous fashion, fourth node P14 is connected via a sixth ohmic resistor R16 to first anode terminal A1, and is connected via a seventh ohmic resistor R17 to second anode terminal A2 of overall circuit 4.

As in the case of the specific embodiment described above, this wiring network also has the effect that an applied tuning voltage $U_A$ becomes effective to the full extent at each of the individual diodes D11 to D16, whereas an applied signal voltage $u_S$, in the present case, is only present to the extent of a sixth of its value at each individual diode D11 to D16.

Wiring networks, that are designed differently, but that generally act the same as disclosed above, are possible, and they are within the scope of the present invention.

One alternative of the exemplary embodiments according to FIG. 6 is an inverted form of this circuit, in which the outer terminal is formed of cathodes, and thus, the third terminal is equivalent to a common anode or a common control terminal. This alternative is usable in units having negative tuning voltage. This alternative provides that, at each node of the series connection, respectively either anodes of the diodes or cathodes of the diodes are connected to each other, the nodes of the cathodes lying between the outside terminal being connected via resistors and/or inductors to the cathodes of those diodes whose cathodes for a first outside terminal and a second outside terminal of the alternative circuit, and the nodes of the anodes lying between the outside terminals being connected to resistors or inductors whose second terminals form the control voltage terminal for supplying the control voltage setting the capacitance.

FIG. 7 shows a circuit diagram of a third exemplary embodiment of a varactor diode alternative circuit according to the present invention. The crux of this additional example is a circuit in which both direct voltage supply terminals are put on their own pins, that is, they are not connected directly to the anode or the cathode of the HF path. This varactor diode alternative circuit includes, as does alternative circuit 4, an even number of, in the present case, four varactor diodes D11, D12, D13 and D14 connected in series alternately opposite to one another, as well as a resistor network or, more generally, an impedance network made up of five resistors R11, R12, R14, R15 and R16. The use of an odd number of diodes is possible here too, and is within the scope of the present invention.

The anode of first varactor diode D11 at the same time forms a first anode A1 of the entire varactor diode alternative circuit. The cathode of first varactor diode D11 is connected to the cathode of second varactor diode D2 at a node P11, and the cathode of third varactor diode D13 is connected to the cathode of fourth varactor diode at a third node P13. The anode of fourth varactor diode D14 at the same time forms a second anode terminal A2 of varactor diode alternative circuit 5. Furthermore, the anode of second varactor diode D12 is connected to the anode of third varactor diode D13 at a second node P12.

The wiring of the diode series connection is described below, using the example of resistors, but, in analogy to the example embodiments described above, of the first exemplary embodiment, it could just as well be embodied using inductors or alternatively using low-pass filters, that is, for example, using RL elements.

First node P11, that is, the cathodes of first varactor diode D11 and second varactor diode D12, is connected to a cathode terminal K of alternative circuit 5, via a first ohmic resistor R11. Likewise, third node P13, that is, the cathode of third varactor diode D13 and of fourth varactor diode D14 is connected to cathode terminal K of overall circuit 5 via a second ohmic resistor R12.

Furthermore, first anode terminal A1 of the overall circuit is connected via a third resistor R14, second node P12 is connected via a fourth resistor R15, and also second anode terminal A2 of the overall circuit is connected via a fifth resistor R16 to a third anode terminal A of overall circuit 5.

In this example, tuning voltage $U_A$ is applied between third anode terminal A and cathode terminal K. As in the case of the specific embodiment described above, this wiring network also has the effect that an applied tuning voltage $U_A$ becomes effective to the full extent at each of the individual diodes D11 to D14, whereas an applied signal voltage $u_S$, in the present case, is only present to the extent of a quarter of its value at each individual diode D11 to D14.

This alternative circuit is particularly suitable for a parallel resonant circuit in pi-configuration, such as in the intermediate circuit of an automobile radio unit.

The design of the wiring network has implications for the load and thus the quality of the oscillating circuit (speaks for a high ohmic design) and on the reaction time when setting new capacitance values (reacts faster in the case of a low ohmic wiring). Generally, the last aspect is more uncritical, since the time constant of the oscillating circuit tuning is very small compared to other relevant time constants, such as the PLL response time of a receiver. For this reason, often high ohmic resistors are quite sufficient for direct voltage supply, and only in the case of a greater conflict of aims between reaction time and oscillator circuit load does a frequency-selective wiring having multi-stage low-pass filters and/or the use of coils become necessary. In these cases it is especially advantageous to select a design of the wiring network having the same time constants in all partial paths, so that each change in tuning voltage $U_A$ shows an effect at all diodes at the same speed. This is achieved in the third exemplary embodiment according to FIG. 7 in that resistors R11, R12 and R15 have the same resistance value, and resistors R14 and R16 have twice the resistance value compared to that of the other resistors. The wiring network according to FIG. 7, in contrast to the other exemplary variants, is designed so that all direct current paths run for all diodes in the same way via two resistors in each case. This leads to equal time constants when R14 and R16 are twice as great as the remaining resistors, since they only supply one diode each with current, but all the other resistors supply two each. Because of this, at a given time constant of the direct current path, a minimal load, and thus a quality that is as high as possible of the oscillator circuit is achieved.

Wiring networks, that are designed differently, but that act the same in the above meaning, are possible, and they are within the scope of the present invention.

Figure 1:
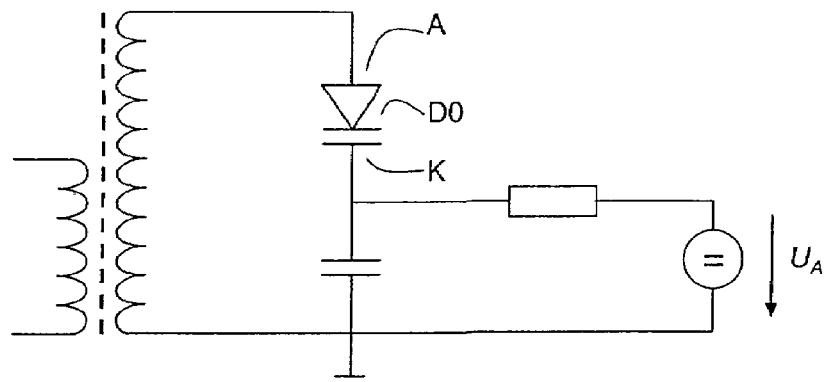
FIG. 1 shows for example, a circuit diagram of an oscillator circuit in which a conventional varactor diode is installed as an electrically controllable capacitance for tuning the oscillator circuit.

In all the described exemplary embodiments, the number of varactor diodes used may be changed to higher than the stated diode numbers. In the case of the first and third exemplary embodiment of the alternative circuit for a simple varactor diode according to FIG. 1, the minimum number of diodes is three varactor diodes, and in the case of the alternative circuit for the varactor double diode according to FIG. 5, it is four varactor diodes. An upper limit for the number of usable varactor diodes comes about, for one thing, by a possibly limited production volume, and for another thing by the fact that the utilizable blocking layer capacitance decreases with an increasing number of diodes. In order to counter the latter effect, it may be provided that, instead of simple varactor diodes in the alternative circuits described, these are each replaced by parallel connections of varactor diodes, and, thus, to multiply the blocking layer capacitance per diode D1, ..., D5 and D11, ..., D16.

What is claimed is:

1. A varactor diode alternative circuit, comprising:
    at least three varactor diodes that are in each case connected in series alternatingly opposite to one another; and
    at least one of a resistor network and an inductor network, the at least one of the resistor network and the inductor network coupled to the at least three varactor diodes;
    wherein:
        the varactor diode alternative circuit is adapted to tune an oscillating frequency of an oscillator circuit whose oscillating frequency is tunable, the tuning being by adjusting a capacitance of the alternative circuit in response to a control voltage;
        at each of the varactor diodes, the control voltage is applied at least approximately at full extent, and an alternating voltage that is applied at the series connection of the varactor diodes, which is at a higher frequency compared to the control voltage, is distributed at least approximately uniformly to the varactor diodes;
        the at least three varactor diodes include one of an even number of varactor diodes and an even number of parallel connections of varactor diodes;
        at each node of the series connection, respectively either anodes of the varactor diodes or cathodes of the varactor diodes are connected to one another;
        nodes of the cathodes lying between outside terminals are connected via at least one of resistors and inductors to the cathodes of the varactor diodes whose cathodes form a first outside terminal and a second outside terminal of the alternative circuit; and
        nodes of the anodes lying between the outside terminals are connected to one of resistors and inductors whose second terminals form a control voltage terminal for supplying the control voltage to set the capacitance.

2. The varactor diode alternative circuit as recited in claim 1, wherein the at least one of the resistor network and the inductor network is arranged so that anodes of the varactor diodes, with respect to the control voltage supplied to the circuit, are connected to a first electrical potential, and cathodes of the varactor diodes, with respect to the control voltage, are connected to a second electrical potential that is higher, by the control voltage, compared to the first electrical potential.

3. An electrical circuit device or an electrical unit, comprising:
    an oscillator circuit having a tunable oscillating frequency; and
    a varactor diode alternative circuit configured to tune the oscillating frequency by adjusting a capacitance of the alternative circuit in response to a control voltage, the alternative circuit including:
        at least three varactor diodes that are in each case connected in series alternatingly opposite to one another; and
        at least one of a resistor network and an inductor network, the at least one of the resistor network and the inductor network coupled to the at least three varactor diodes;
    wherein:
        at each of the varactor diodes, the control voltage is applied at least approximately at full extent, and an alternating voltage that is applied at the series connection of the varactor diodes, which is at a higher frequency compared to the control voltage, is distributed at least approximately uniformly to the varactor diodes;
        the at least three varactor diodes include one of an even number of varactor diodes and an even number of parallel connections of varactor diodes;
        at each node of the series connection, respectively either anodes of the varactor diodes or cathodes of the varactor diodes are connected to one another;
        nodes of the cathodes lying between outside terminals are connected via at least one of resistors and inductors to the cathodes of the varactor diodes whose cathodes form a first outside terminal and a second outside terminal of the alternative circuit; and
        nodes of the anodes lying between the outside terminals are connected to one of resistors and inductors whose second terminals form a control voltage terminal for supplying the control voltage to set the capacitance.

4. The electrical circuit device or electrical unit as recited in claim 3, wherein the at least one of the resistor network and the inductor network is arranged so that anodes of the varactor diodes, with respect to the control voltage supplied to the alternative circuit, are connected to a first electrical potential, and cathodes of the varactor diodes, with respect to the control voltage, are connected to a second electrical potential that is higher, by the control voltage, compared to the first electrical potential.

* * * * *